(12) United States Patent
Kajiya et al.

(10) Patent No.: US 9,155,193 B2
(45) Date of Patent: Oct. 6, 2015

(54) FLEXIBLE CIRCUIT BOARD AND ITS METHOD FOR PRODUCTION

(75) Inventors: Atsushi Kajiya, Tokyo (JP); Hidekazu Yoshihara, Tokyo (JP)

(73) Assignee: Nippon Mektron, Ltd., Minato-Ku (JP)

( * ) Notice: Subject to any disclaimer, the term of this patent is extended or adjusted under 35 U.S.C. 154(b) by 282 days.

(21) Appl. No.: 13/641,769

(22) PCT Filed: Dec. 24, 2010

(86) PCT No.: PCT/JP2010/073386
§ 371 (c)(1),
(2), (4) Date: Nov. 15, 2012

(87) PCT Pub. No.: WO2011/132343
PCT Pub. Date: Oct. 27, 2011

(65) Prior Publication Data
US 2013/0056248 A1 Mar. 7, 2013

(30) Foreign Application Priority Data

Apr. 19, 2010 (JP) ................................. 2010-095804

(51) Int. Cl.
*H05K 1/00* (2006.01)
*H05K 3/00* (2006.01)
(Continued)

(52) U.S. Cl.
CPC .............. *H05K 1/028* (2013.01); *H05K 1/0218* (2013.01); *H05K 1/189* (2013.01);
(Continued)

(58) Field of Classification Search
CPC ... H05K 1/028; H05K 1/189; H05K 2201/05; H05K 2201/051; H05K 2203/1105; H05K 2201/0129; Y10T 29/49117

USPC .............. 174/69, 257, 254; 29/825, 829, 864, 29/861; 439/67
See application file for complete search history.

(56) References Cited

U.S. PATENT DOCUMENTS 3,300,572 A * 1/1967 Dahlgren et al. ............... 174/69
4,861,945 A    8/1989 Buck et al.
(Continued)

FOREIGN PATENT DOCUMENTS

CN      1420714 A    5/2003
CN      1829412 A    9/2006
(Continued)

OTHER PUBLICATIONS

International Search Report dated Feb. 8, 2011.
(Continued)

*Primary Examiner* — Angel R Estrada
*Assistant Examiner* — Dimary Lopez Cruz

(57) ABSTRACT

A flexible circuit board and a method for production thereof in which in cases where elastic wiring in movable parts is required, the wiring can be made to expand and contract with a simple arrangement, and the circuit board is excellent in weight and size reduction, and breaking or disconnection and exfoliation of a wiring layer do not take place easily, even in cases where the circuit board is deformed in a repeated manner. The flexible circuit board which has an insulating film made of a thermoplastic resin, a wiring layer formed on the insulating film, and an insulating layer made of a thermoplastic resin and formed on the wiring layer. A spiral part shaped into a spiral shape is provided in at least a part of the flexible circuit board, and the flexible circuit board is constructed to be expandable and contractable, and/or torsionally deformable in the spiral part.

17 Claims, 6 Drawing Sheets

(51) Int. Cl.
  *H05K 1/02* (2006.01)
  *H05K 1/18* (2006.01)

(52) U.S. Cl.
  CPC ............ *H05K 2201/0129* (2013.01); *H05K 2201/0141* (2013.01); *H05K 2201/051* (2013.01); *H05K 2203/1105* (2013.01); *Y10T 29/49117* (2015.01)

(56) References Cited

U.S. PATENT DOCUMENTS

| | | | |
|---|---|---|---|
| 5,525,760 A * | 6/1996 | Rohatgi et al. | 174/254 |
| 5,631,446 A * | 5/1997 | Quan | 174/254 |
| 5,747,743 A * | 5/1998 | Kato et al. | 174/254 |
| 7,400,513 B2 * | 7/2008 | Wakabayashi et al. | 361/770 |
| 7,531,752 B2 * | 5/2009 | Hirakata | 174/254 |
| 7,641,488 B2 * | 1/2010 | Ho et al. | 439/162 |
| 7,796,883 B2 * | 9/2010 | Darbha et al. | 396/542 |
| 8,227,699 B2 * | 7/2012 | Honjo | 174/255 |
| 8,397,378 B2 * | 3/2013 | Sohn et al. | 29/830 |
| 2003/0094697 A1 | 5/2003 | Higashida et al. | |
| 2008/0182435 A1 | 7/2008 | Ho et al. | |
| 2010/0170692 A1 * | 7/2010 | Lu et al. | 174/69 |

FOREIGN PATENT DOCUMENTS

| | | |
|---|---|---|
| CN | 101237743 A | 8/2008 |
| JP | 08-057792 A1 | 3/1996 |
| JP | 2002-094191 | 3/2002 |
| JP | 2006-093562 AI | 4/2006 |
| JP | 2008-187154 A1 | 8/2008 |
| JP | 2009-246380 A1 | 10/2009 |

OTHER PUBLICATIONS

European Search Report, European Patent Application No. 10850284.0, dated Aug. 9, 2013 (9 pages).
Chinese Office Action (With English Translation), Chinese Application No. 201080066280.6, dated Dec. 22, 2014 (13 pages).
Taiwanese Office Action, dated Dec. 26, 2014 (6 pages).

* cited by examiner

FLEXIBLE CIRCUIT BOARD AND ITS METHOD FOR PRODUCTION

BACKGROUND OF THE INVENTION

1. Field of the Invention

The present invention relates to a flexible circuit board and its method for production method. More specifically, the invention relates to a flexible circuit board and a method for production thereof, in which the flexible circuit board can be used for connection between component parts which are mounted on various kinds of electronic equipment such as communication and visual equipment, etc., as well as automotive vehicles, aircrafts, robots, etc., or can be used for amounting circuit board with components mounted thereon, in particular for parts, such as movable parts of robots, etc., on which elasticity (expansion and contraction property) is required.

2. Description of Related Art

In recent years, development of robots is remarkable, and robots capable of performing a variety of motions are appearing. In addition, with respect to wearable electronic equipment which can be fitted or attached to a human body or clothing, a many variety of such equipment are developed. Many electric wires for supplying electric power or for transmitting signals are used in these robots and wearable electronic equipment, but in general, an electric wire is constructed such that it has a copper wire as a core, with its outer periphery covered by an insulating material, so the electric wire itself has almost no elasticity. For this reason, it is necessary to arrange an electric wire while providing a margin so as not to obstruct the motion of a robot or a human body, which becomes an obstacle to the design of devices and practical use in many cases.

Accordingly, in the past, there has been a demand for electric wires which are constructed to be elastic or expandable and contractable, in order to avoid such an obstacle to the design of devices as well as practical use. In particular, in equipment such as a front line humanoid type robot, a power assisted device which is worn or fitted on a human body so as to assist muscular power, many electric wires for operating end motors by way of multiple degree of freedom joints, respectively, and many electric wires for transmitting signals from various kinds of sensors arranged at end points are wired, and in order to enhance the degree of freedom of wiring in the multiple degree of freedom joints, the demand with respect to those electric wires which are constructed to be elastic or expandable and contractable is increasing more and more. Here, note that a related technique is disclosed in a first patent document, as listed below.

PRIOR ART REFERENCES

Patent Documents

First Patent Document: Japanese patent application laid-open No. H8-57792

PROBLEMS TO BE SOLVED BY THE INVENTION

However, in the conventional technique, there are the following problems. As a representative example of conventional electric wires, which are constructed to be elastic, there are mentioned curled cords which are each formed into a coiled shape. However, curled cords are used for landline or fixed-line telephones, etc., but have a problem that they are in general thick and heavy, and further have another problem that curled cords are easily entangled with each other, and hence, they are not suitable for humanoid type robots or power assisted devices which use many electric wires.

On the other hand, in recent years, many arm robots are used as industrial robots. In this kind of arm robots, it is required that electrical cables for supplying electric power or for transmitting signals used for an end effector mounted on a tip side of a robot arm, a joint part of a robot arm, etc., be arranged to extend from a root side of a robot arm to a tip side thereof. In addition, depending on the drive form of the end effector or the joint part of the robot arm, it may be necessary to arrange an air (pneumatic) hose or a hydraulic pressure hose from the root side of the robot arm to the tip side thereof.

Accordingly, with the conventional arm robot, in cases where various kinds of cables such as an electrical cable, an air hose, a hydraulic hose, etc., are arranged in a joint part, in order to prevent bending or breaking (disconnection) of the cables, there is adopted a wiring technique in which the cables are taken out to the outside at a base end side position of the joint part of the robot arm so that the cables are arranged in a outside of the joint part, and then the cables are again introduced into the arm at a position which is nearer to its tip end than the joint part.

In addition, there has also been known a construction in which a support rod is arranged at the position of the center of joint rotation in the joint part of the arm robot, and the support rod around which a cable has been wound in advance is received inside the robot arm so as to prevent bending or breaking (disconnection) of the cable. Specifically, the bending or breaking of the cable is prevented at the time of the rotary operation of the joint part of the robot arm, by causing that portion of the cable which is wound around the support rod to expand and contract in an elastic manner according to the rotation of the joint part (for example, refer to a first patent document).

However, in the technique of arranging a cable in an outside space of a robot arm, a space for slacking the cable is required in the surrounding area of the joint part of the robot arm. Further, there is a fear that at the time of the rotary operation of the joint part of the robot arm, the cable may be damaged and disconnected by being subject to an excessive force or interfering with movement of the robot arm.

In addition, in cases where the support rod is arranged in the position of the center of joint rotation, as disclosed in the first patent document, there are the following problems. That is, it is necessary to provide the support rod separately, thus leading to an increase in the cost of production, etc., and besides, the structure of the receiving part for the cable becomes complicated, so that wiring of the cable, disassembly in the case of maintenance, or extraction of the cable takes time and effort very much.

More specifically, with the above-mentioned conventional structure or arrangement, it is impossible to provide a circuit board and its method for production in which in cases where elastic or expandable and contractable wiring in the movable parts of the robot, etc., is required, the wiring can be made to expand and contract with a simple construction or arrangement, and at the same time the circuit board is excellent in weight reduction as well as size reduction, and breaking or disconnection and exfoliation of a wiring layer do not take place easily, even in cases where the circuit board is deformed in a repeated manner.

Accordingly, the present invention has for its object to provide a flexible circuit board and a method for production thereof in which in cases where elastic wiring in movable parts of a robot, etc., is required, the wiring can be made to expand and contract with a simple arrangement, and at the same time, the circuit board is excellent in weight reduction as well as size reduction, and breaking or disconnection and exfoliation of a wiring layer do not take place easily, even in cases where the circuit board is deformed in a repeated manner.

MEANS FOR SOLVING THE PROBLEMS

In order to achieve the above-mentioned object, the present invention resides in a flexible circuit board which has an insulating film made of a thermoplastic resin, a wiring layer formed on the insulating film, and an insulating layer made of a thermoplastic resin and formed on the wiring layer, and which is characterized in that a spiral part shaped into a spiral shape is provided in at least a part of the flexible circuit board, and the flexible circuit board is constructed to be expandable and contractable, and/ or torsionally deformable in the spiral part.

According to such a construction, because of the use of the flexible circuit board, it is possible to attain a reduction in size and weight as compared with the conventional electric wire. In addition, the flexible circuit board is constructed such that it can be expanded and contracted in the spiral part formed in at least a part thereof, as a result of which the flexible circuit board can be inserted, in its contracted state, into a small space between component parts, for example. That is, by making effective use of a dead space in a mounting place of the flexible circuit board, it is possible to intend to make the device, etc., lighter, thinner, shorter and smaller as well as to reduce the number of mounting parts. Here, note that a plurality of spiral parts may be formed or arranged in the flexible circuit board, and for example, almost the whole of the flexible circuit board may be shaped into a spiral shape. In this case, the flexible circuit board will have further excellent elasticity.

In addition, in the present invention, the flexible circuit board is constructed such that it is able to expand and contract in the spiral part. As a result, it is not necessary to provide the above-mentioned conventional support rod or the like, for example, in order to make the flexible circuit board expand and contract. Therefore, the flexible circuit board can be made to expand and contract with a simple arrangement. Moreover, the spiral part of the present invention is a part "shaped" into a spiral shape. In other words, the spiral shape is maintained even at the time of deformation of the flexible circuit board, and hence, even in cases where the flexible circuit board deforms in a repeated manner, a break or disconnection and exfoliation of the wiring layer do not take place easily, thus making it possible to maintain the excellent reliability of connection. Here, note that "shaping" referred to herein means a state in which a shape is formed so as to enable the shape to be maintained by itself without requiring any support means or auxiliary (assisting) means from the outside.

Further, in the present invention, not only expansion and contraction but also torsional deformation can be made in the spiral part, so it is possible to further improve the degree of freedom of the deformation of the flexible circuit board, and at the same time, in this case, too, the spiral part as a whole is able to perform torsional deformation, thereby preventing local concentration of stress. In addition, even if the flexible circuit board is made to contract, expand, or twist or torsion in a repeated manner, the stress applied to the wiring layer can be alleviated or eased with the entire flexible circuit board, and hence, there is a low possibility that exfoliation or fracture of the wiring layer will occur, thus making it possible to maintain excellent connection reliability.

Furthermore, in the present invention, the insulating film and the insulating layer of the flexible circuit board are formed of the thermoplastic resin, so the flexible circuit board, which has become unnecessary, can be restored to its original shape by being heating again, which leads to recycling or reuse of resources. "The wiring layer formed on the insulating film" referred to herein includes not only a case in which the wiring layer is directly formed on the insulating film, but also a case in which the wiring layer is formed on the insulating film through an adhesive layer, etc.

In addition, it is preferable that the spiral part be shaped in such a manner that a part of its circumferential surface and a part of its circumferential surface mutually overlap with each other.

According to such an arrangement, it is difficult for a gap to be produced in the spiral part even in the case of deformation of the flexible circuit board, so it is possible to prevent not only entanglement between portions of the flexible circuit board but also entanglement of the flexible circuit board with other wiring in the spiral part. In addition, it becomes possible to further ensure the elasticity (expansion and contraction property) of the flexible circuit board, and hence, by making effective use of a dead space in a mounting place of the flexible circuit board, it is possible to intend to make the electronic equipment, etc., lighter, thinner, shorter and smaller as well as to reduce the number of mounting parts.

Moreover, it is preferable that the spiral part be shaped by an arc shaped portion which is formed in the flexible circuit board in a state where the spiral part has not been shaped.

According to such a construction, the spiral part is formed by the arc shaped portion, so the diameter of a hollow interior portion of the spiral part can be made almost constant. As a result, in cases where another wiring, etc., is made to pass through the hollow interior portion of the spiral part, for example, the possibility that the wiring and the spiral part interfere with each other can be reduced.

Further, it is preferable that the thermoplastic resin be a liquid crystal polymer.

According to such a construction, by the use of the liquid crystal polymer which is relatively inexpensive and easy to be shape, it becomes possible to suppress the cost of the production of the flexible circuit board.

In addition, it is preferable that the wiring layer be formed on opposite side surfaces of the insulating film, and a wiring layer formed on one side surface of the insulating film be used as a signal line for signal transmission, whereas a wiring layer formed on the other side surface of the insulating film be used as a power line for supplying electric power.

According to such a construction, even when a large current is caused to flow through the power line or when a voltage applied thereto is made high, the thickness of a wiring layer used for the power line for supplying power can be made thin. As a result, it is possible to further reduce the weight and size of the flexible circuit board, and to improve the elasticity and flexibility thereof as well.

Moreover, it is further characterized in that wiring layers are formed on opposite sides of the insulating film, and that a wiring layer formed on one side surface of the insulating film is used as at least one of a signal line for signal transmission and a power line for supplying electric power, whereas a wiring layer formed on the other side surface of the insulating film is used as a ground pattern, and at the same time, in the spiral part, the other side surface is arranged at an outer peripheral side more outside than the one side surface.

According to such an arrangement, the ground pattern is arranged at an outer peripheral side in the spiral part, so that the ground pattern functions as a shield layer, thus making it possible to prevent the propagation of noise from the outside to the signal line and the power line which are arranged at an inner peripheral side.

Further, it is characterized in that the spiral part is constructed in such a manner that another wiring is able to pass through its hollow interior portion.

According to such a construction, by making effective use of a dead space of the flexible circuit board, it is possible to intend to make the electronic equipment, etc., lighter, thinner, shorter and smaller as well as to reduce the number of mounting parts.

In another aspect, in order to achieve the above-mentioned object, the present invention resides in a method for production of a flexible circuit board which is characterized by comprising: a first step to wind a flexible circuit board around a shaping device of a circular column shape in a state in which tension is applied to opposite ends of the flexible circuit board; and a second step to heat a portion of the flexible circuit board wound around the shaping device, thereby to form a spiral part in the flexible circuit board.

According to such a method for production, the spiral part can be formed, with respect to the flexible circuit board, by means of a relatively simple production method, so that the cost of production of the flexible circuit board can be suppressed.

In addition, it is further characterized in that the thermoplastic resin is a liquid crystal polymer, and in the second step, a heating temperature is a temperature at which a surface temperature of the flexible circuit board becomes equal to or higher than 150 degrees C. and less than a thermal deformation starting temperature of the liquid crystal polymer, and a heating time is within 1 hour.

According to such a method for production, because the liquid crystal polymer is heated at the heating temperature which is less than the thermal deformation starting temperature of the liquid crystal polymer, the liquid crystal polymer is not fluidized to flow, and the external appearance and performance of the flexible circuit board are not impaired. In addition, because the heating temperature is such that the surface temperature of the flexible circuit board becomes equal to or higher than 150 degrees C., the spiral part can be shaped with respect to the liquid crystal polymer in a reliable manner, and further, even after the heating is finished, the diametrical size of a hollow portion is maintained, and the spiral part do not return to its original shape. Moreover, if the heating time is within 1 hour, the efficiency of production can be improved, and at the same time, it becomes possible to avoid problems of the discoloration and thermal deformation of the liquid crystal polymer, as well as damage to the wiring layer, which would otherwise be generated by heating for an extended period of time.

SUMMARY OF THE INVENTION

As described above, according to the present invention, it becomes possible to provide a flexible circuit board and a method for production thereof in which in cases where elastic wiring in movable parts of a robot, etc., is required, the wiring can be made to expand and contract, and/or to torsionally deform with a simple arrangement, and at the same time, the circuit board is excellent in weight reduction as well as size reduction, and breaking or disconnection and exfoliation of a wiring layer do not take place easily, even in cases where the circuit board is deformed in a repeated manner.

DETAILED DESCRIPTION OF THE INVENTION

Hereinafter, modes for carrying out the present invention will be described in detail by way of example with reference to the attached drawings. However, the dimensions, materials, shapes, relative arrangements and so on of component parts described in the following embodiment are not intended to limit the scope of the present invention to these alone in particular as long as there are no specific statements.

[Embodiment]

Reference will be made to a flexible circuit board and a method for production thereof according to an embodiment to which the present invention can be applied, while referring to FIG. 1 through FIG. 6.

(1: Schematic Construction of Flexible Circuit Board)

Figure 1A:
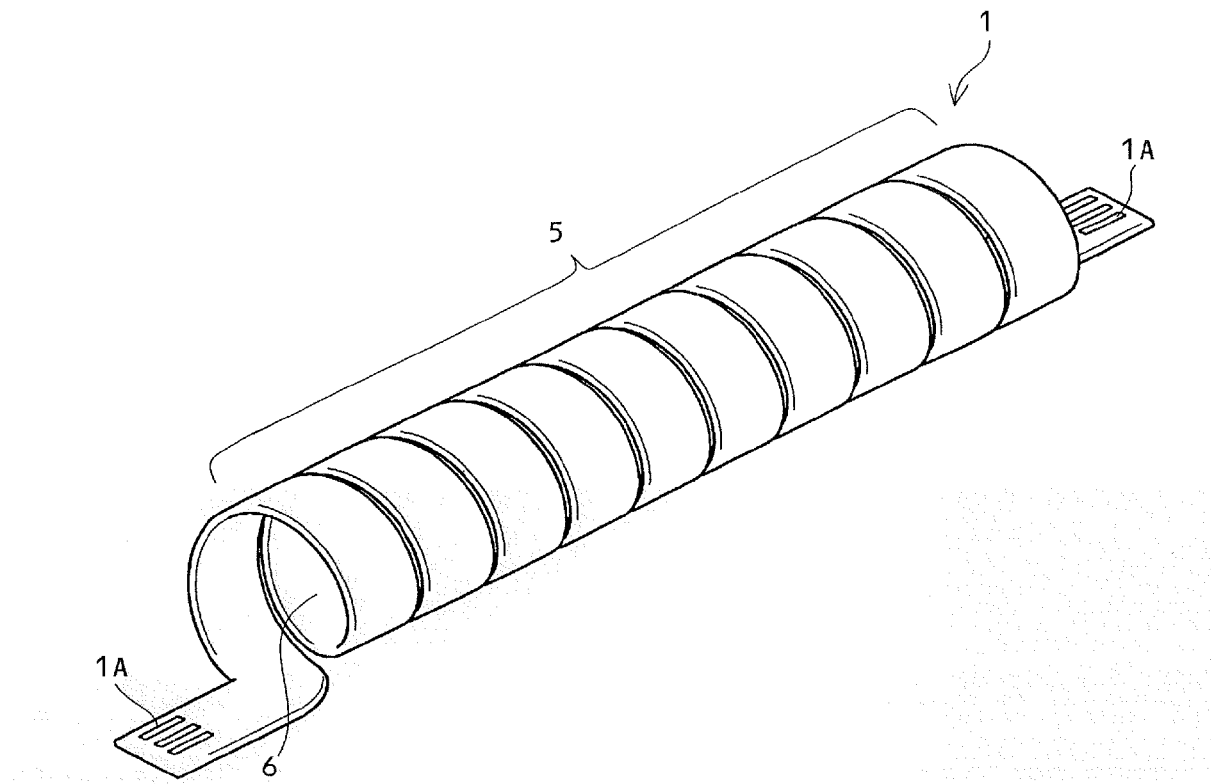
[FIG. 1] is schematic construction views of a flexible circuit board according to the present invention.
Figure 1B:
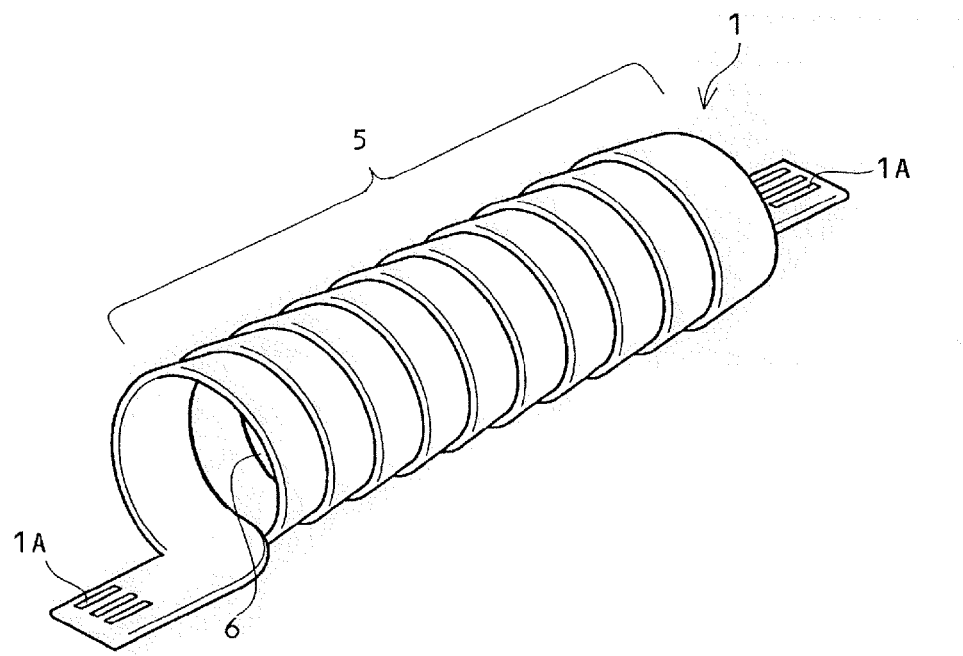
Figure 4A:
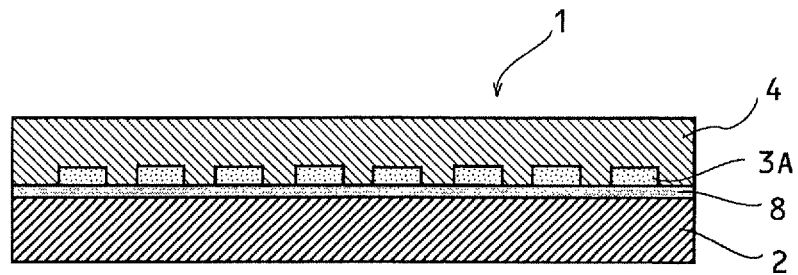
[FIG. 4] is schematic construction views of a flexible circuit board according to the present invention.

Reference will be made to the schematic construction of a flexible circuit board according to this embodiment of the present invention, while referring to FIG. 1(a), FIG. 1(b) and FIG. 4(a). FIG. 1(a), FIG. 1(b) and FIG. 4(a) show the schematic constructions of the flexible circuit board according to this embodiment, respectively.

As shown in FIG. 4(a), the flexible circuit board 1 has an insulating film 2 made of a thermoplastic resin, a wiring layer 3A which is formed on the insulating film 2, and an insulating layer 4 which is formed on the wiring layer 3A and which is made of a thermoplastic resin. The wiring layer 3A is adhered on the insulating film 2 by means of an adhesive layer 8, but other constructions may be possible in which the wiring layer 3A is formed directly on the insulating film 2 without the provision of the adhesive layer 8.

As further shown in FIG. 1(a), the flexible circuit board 1 is provided, on at least a portion thereof, with a spiral part 5 which is shaped into a spiral shape, so that it is constructed to be expandable and contractable, and/or torsionally deformable in the spiral part 5. Here, note that a reference numeral 6 shown in FIG. 1(a) denotes a hollow interior portion of the spiral part 5, and a reference character 1A denotes terminals (which can be electrically connected to the wiring layer 3A) arranged at opposite ends of the flexible circuit board 1.

In addition, as shown in FIG. 1(b), the spiral part 5 of the flexible circuit board 1 may be formed in such a mariner that a part of its circumferential surface and another adjacent part of the circumferential surface (i.e., a part of an outer peripheral surface of one of adjacent spirals and a part of an inner peripheral surface of the other thereof) may mutually overlap with each other. According to this, it becomes possible to further improve the elasticity (expansion and contraction property) of the spiral part 5, while further reducing the size of the flexible circuit board 1. As a result, by making effective use of a dead space in a mounting place of the flexible circuit board, it is possible to intend to make the electronic equipment, etc., lighter, thinner, shorter and smaller as well as to reduce the number of mounting parts. In addition, it is difficult for a gap to occur in the spiral part 5 even at the time of deformation of the flexible circuit board 1, so it is possible to avoid the problem that the flexible circuit board 1 becomes entangled with other wiring.

The wiring layer 3A is formed by bonding a well-known metal foil, such as a rolled copper foil, an electrolytic copper foil, or the like, to the insulating film 2 by means of the adhesive layer 8. Alternatively, the wiring layer 3A can also be formed on a surface of the insulating film 2 (or a surface of the adhesive layer 8 formed on the insulating film 2) by means of an appropriate method such as vapor deposition, sputtering, or the like, by using a metal such as copper or silver. The adhesive layer 8 is formed by using a well-known thermoplastic resin such as polyimide, or a well-known thermosetting resin such as cyanate ester based resin, polyphenylene ether based resin, phenol based resin, naphthalene resin, urea resin, amino resin, alkyd resin, silicon resin, furan resin, unsaturated polyester resin, epoxy resin, polyurethane resin, etc. Alternatively, the adhesive layer 8 can also be formed of any of the above-mentioned organic resins with an inorganic filler such as silica, alumina or the like dispersed therein.

For the insulating film 2 and the insulating layer 4, there are recommended thermoplastic resins in particular in cases where heat resistance is required, and the following are preferred: liquid crystal polymer (e.g., trade name "RODRUN" made by Unitika, Ltd., "EPE" made by Mitsubishi Chemical Corporation, "IDEMITSU LCP" made by an Idemitsu Petrochemical Company, Ltd., "Ekonol" made by Sumitomo Chemical Co., Ltd. "XYDAR" made by Nippon Petro Chemicals Co., Ltd., "LCP" made by Tosoh Corporation, "VECTRA" made by Hoechst Celanese Corporation, "SRP" made by ICI, "VECSTAR" made by Kuraray Co., Ltd., "BIAC" made by Japan Gore Tex, Inc., "SUMIKASUPER LCP" made by Sumitomo Chemical Co., Ltd.); polyamide imides (e.g., polyamide imide obtained from trimellitic acid and aromatic diamines such as diaminodiphenylmethane, diaminodiphenyl ether, m-, or p-phenylenediamine, etc.); thermoplastic polyimide (e.g., trade name "AURUM", made by Mitsui Chemicals, Inc.), etc. On the other hand, in cases where heat resistance is not required, the following thermoplastic resins may be used. For example, there are mentioned polyethylenenaphthalate (PEN), polyethylene terephthalate (PET), cycloolefin polymer (COP, e.g., trade names "ZEONEX" (made by Zeon Corporation), "ZEONOR" (made by Zeon Corporation), etc.), and so on. The thermoplastic resins used for the insulating film 2 and the insulating layer 4 may be the same material, or different materials may be selected for them, respectively. Here, note that in the following, reference will be made to the case where a liquid crystal polymer is used for the insulating film 2 and the insulating layer 4.

As stated above, the flexible circuit board 1 according to this embodiment is formed, in at least a part thereof, with the spiral part 5 having the hollow interior portion 6. Because of such a shape, it becomes possible for the flexible circuit board 1 to carry out elastic deformation, and when an external force acts on the flexible circuit board 1, the flexible circuit board 1 as a whole can be deformed in an elastic (expandable and contractable) manner, thereby making it possible to prevent stress from concentrating locally thereon. Note that not only expansion and contraction deformation but also torsional deformation can be made, it is possible to further improve the degree of freedom of the deformation of the flexible circuit board 1, and at the same time, it is also possible to prevent stress from be concentrating locally because the spiral part 5 torsionally deforms as a whole in this case, too. In addition, even if the flexible circuit board 1 is made to contract, expand, or twist or torsion in a repeated manner, the stress applied to the wiring layer 3A can be alleviated or eased with the entire flexible circuit board, and hence, there is a low possibility that exfoliation or fracture of the wiring layer 3A will occur, thus making it possible to maintain excellent connection reliability.

Here, note that it is possible for another wiring to pass through the hollow interior portion 6 of the spiral part 5. According to this, by making effective use of a dead space of the flexible circuit board, it is possible to intend to make the electronic equipment, etc., lighter, thinner, shorter and smaller as well as to reduce the number of mounting parts.

Further, in the flexible circuit board 1 according to this embodiment, the spiral part 5 is a part "shaped into a spiral shape". That is, the flexible circuit board 1 is shaped in such a manner that it is able to maintain the spiral shape thereof by itself, without requiring any external support means, any auxiliary means, etc. Therefore, it is not necessary to provide a support rod separately, as in a conventional cable. Moreover, in this embodiment, the insulating film 2 and the insulating layer 4 are formed of the thermoplastic resin, so the flexible circuit board 1, which has become unnecessary, can be restored to its original shape by being heating again, which leads to recycling or reuse of resources.

(2: Arrangement of Wiring Layer)

Figure 4B:
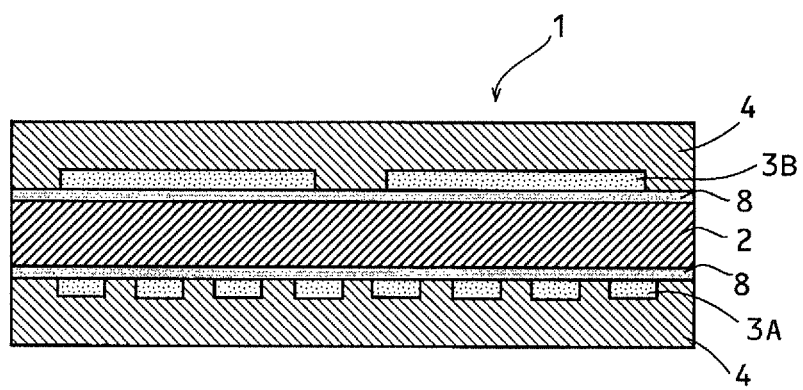

Although in the above description, reference has been made to arrangement in which the wiring layer 3A is formed only on a single side of the insulating film 2, as shown in FIG. 4(a), the arrangement of the wiring layer 3A is not limited to this, but may be such that wiring layers 3A, 3B are arranged on opposite sides, respectively, of the insulating film 2, as shown in FIG. 4(b). In this case, it is preferable that the wiring layer 3A formed on one side surface be used as a signal line for signal transmission, whereas the wiring layer 3B formed on the other side surface be used as a power line for supplying electric power.

In general, when a large current is caused to flow through the power line 3B or when a voltage applied thereto is made high, the power line 3B for supplying electric power will become thick and a larger space will be required, but according to this embodiment, the thickness of a wiring layer used for the power line 3B can be made thin in such a case. As a result, it is possible to further reduce the weight and size of the flexible circuit board 1, and to improve the elasticity and flexibility thereof as well.

Figure 4C:
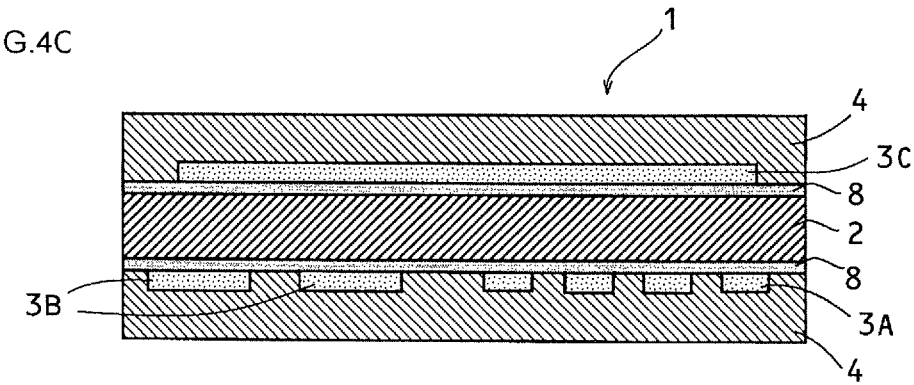

In addition, as shown in FIG. 4(c), it may be constructed such that wiring layers 3A, 3B formed on one side surface are used as a signal line for signal transmission and a power line for supplying electric power, respectively, whereas a wiring layer 3C formed on the other side surface is used as a ground pattern, and at the same time, in the spiral part 5, the ground pattern is arranged at an outer peripheral side than the signal line and the power line. That is, in FIG. 4(c), an upper side is an outer peripheral side in the spiral part 5, and a lower side is an inner peripheral side in the spiral part 5.

According to this, in the spiral part 5, the ground pattern is arranged at the outer peripheral side, and hence, the ground pattern functions as a shield layer, thus making it possible to prevent the propagation of noise from the outside to the signal line and the power line which are arranged at the inner peripheral side. That is, higher connection reliability can be obtained.

(3: Method For Production of Flexible Circuit Board)

Figure 3A:
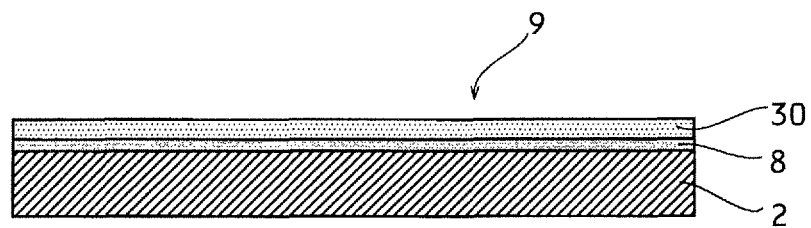
[FIG. 3] is views showing a method for production of a flexible circuit board according to the present invention.

Reference will be made to a method for production of the flexible circuit board 1 according to this embodiment of the present invention, while referring to FIG. 3(a) through FIG. 3(c).

First, a metal-covered film 9 is prepared, as shown in metal-covered film 9 can be formed by forming the adhesive layer 8 on a surface of the insulating film 2 made of a thermoplastic resin, laminating a metal foil 30 on a surface of the adhesive layer 8, and integrating these three layers with one another by means of thermocompression bonding. Here, note that as another technique of forming the metal-covered film 9, there are mentioned a technique of coating a varnish, which is a precursor of an insulating film, on a metal foil, and drying this precursor, a technique of forming a metal layer on an insulating film by vapor deposition or sputtering, a technique of forming a wiring layer on an insulating film, which is coated with a conductive paste, by means of electrolysis plating, and so on.

Figure 3B:
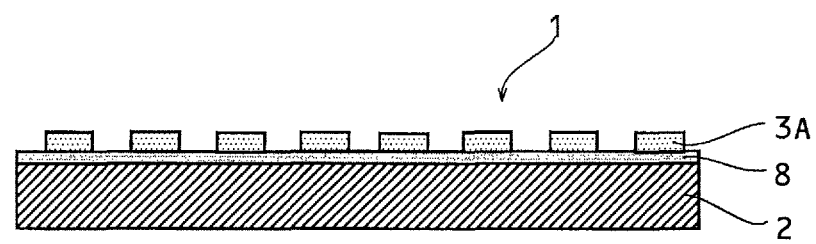
Figure 3C:
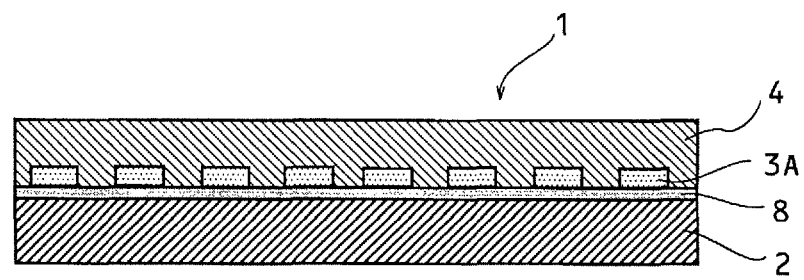

Then, as shown in FIG. 3(b), by etching the metal layer (the metal foil 30) into a desired wiring pattern, the wiring layer 3A is formed, whereby the flexible circuit board 1 is obtained. Further, as shown in FIG. 3(c), the insulating layer 4 is obtained by coating a thermoplastic resin on the wiring layer 3A. Alternatively, the insulating layer 4 may be formed by bonding the insulating film made of a thermoplastic resin by means of thermo compression. As mentioned above, the single-sided flexible circuit board 1 having the insulating layer 4 can be obtained according to the steps shown in FIG. 3(a) through 3(c) which are described herein.

Further, the flexible circuit board 1 according to this embodiment can adopt not only the above-mentioned single sided structure but also a multilayer structure which is shown in the following. Reference will be made to a method for production of a multilayer flexible circuit board having a three-layer structure, while referring to FIG. 5(a) through FIG. 5(c).

Figure 5A:
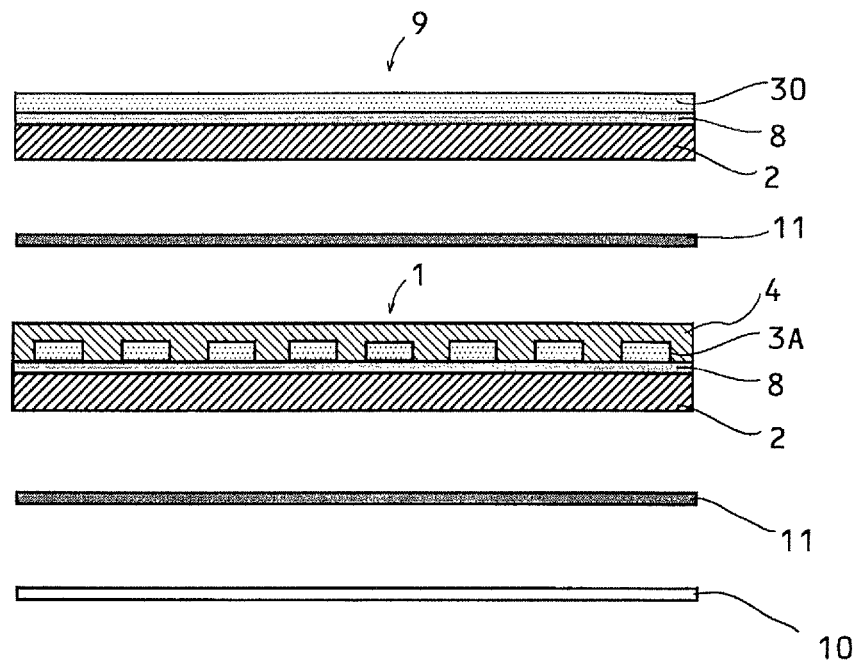
[FIG. 5] is views showing a method for production of a flexible circuit board according to the present invention.

First, as shown in FIG. 5(a), in the production of the multilayer flexible circuit board, first of all, a metal-covered film 9, a single-sided flexible circuit board 1 and a metal foil 10 are prepared, and in addition, two adhesive sheets 11 for adhering these three sheets are prepared. As the adhesive sheets 11, there is used the thermoplastic resin for the above-mentioned insulating layer 4 which has been formed into the shape of a sheet. These are laminated in a manner as illustrated, and then, those which are thus laminated are thermally compressed so that the three sheets are integrated with one another.

Figure 5B:
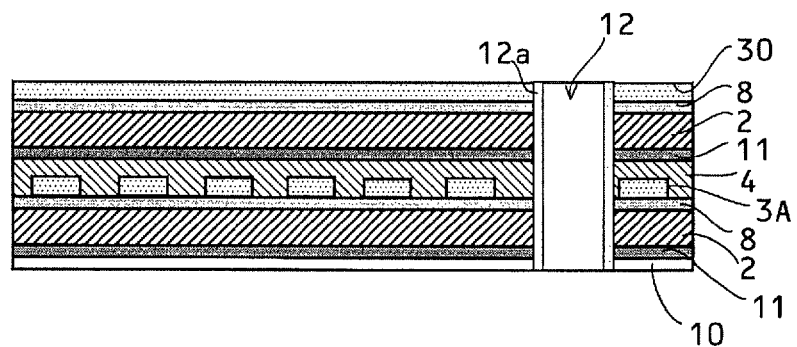

Thereafter, as shown in FIG. 5(b), a through hole 12 is formed at a desired position by the use of a drill or laser, and is then subjected to through hole plating 12a, so that the individual layers including the metal foil 30 of the metal-covered film 9, the wiring layer 3A and the metal foil 10 are electrically connected to one another. A state in which wiring layers are electrically connected to one another through the plating is shown in FIG. 5(b). Here, note that as another method, it is also possible to electrically connect between the individual layers by filling an electrically conductive paste into the through hole 12, and allowing the conductive paste to solidify.

Figure 5C:
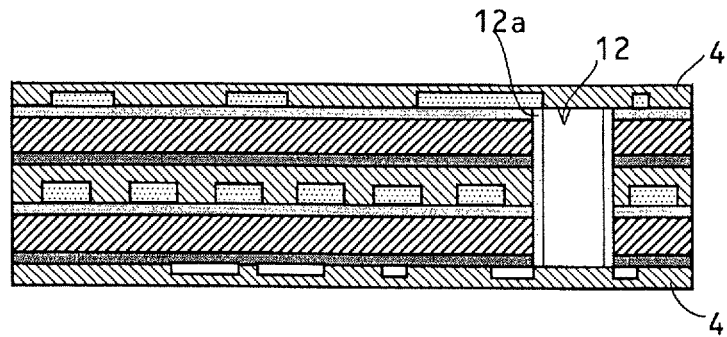

Then, as shown in FIG. 5(c), the metal foils 30, 10 disposed on the opposite respective surfaces are formed into the wiring layers 3A which have desired wiring patterns, respectively, by means of an appropriate technique such as etching, etc. Thereafter, insulating layers 4 are formed on the opposite surfaces, as in the above-mentioned technique (refer to FIG. 3(c)). As a result, the multilayer flexible circuit board 1 having a three-layer structure can be produced. Note that a form having the three-layer structure has been described here, but the structure of the multilayer flexible circuit board 1 is not limited to such a three-layer structure.

(4: Shaping Method of Spiral Part)

Figure 2A:
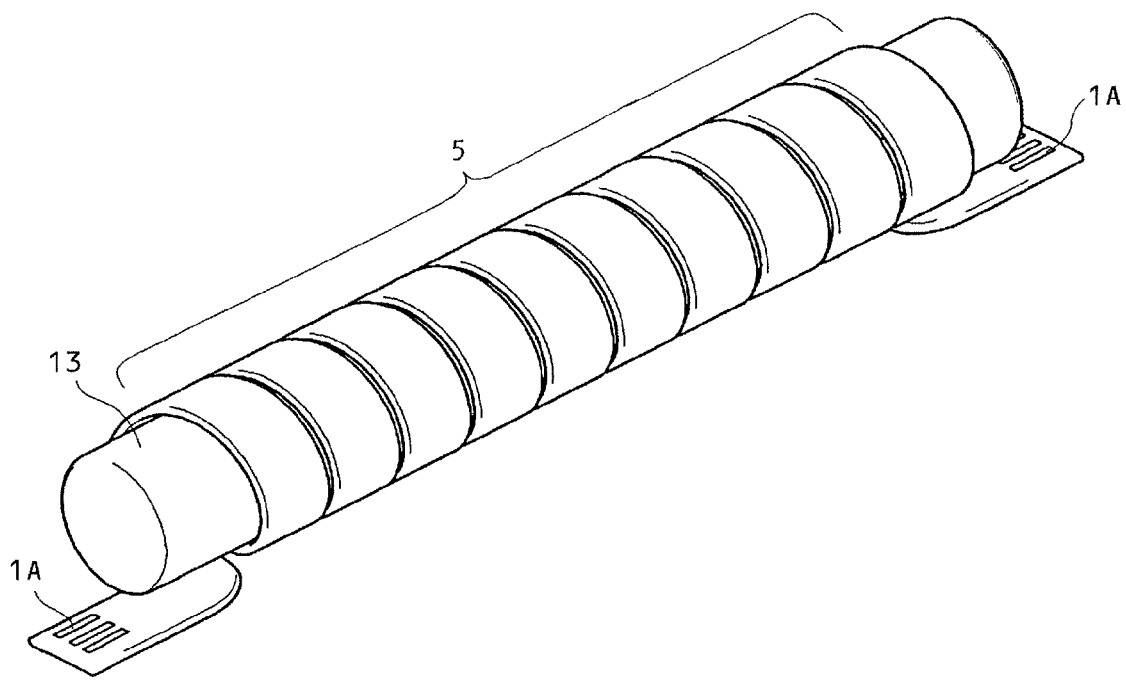
[FIG. 2] is views showing a method for production of a flexible circuit board according to the present invention.

Reference will be made to the method for production of the flexible circuit board 1 according to this embodiment of the present invention, in particular a shaping method for the spiral part 5, while referring to FIG. 2(a) and FIG. 2(b).

The spiral part 5 is formed, after the flexible circuit board 1 has been produced according to the above-mentioned production method, by performing predetermined shaping processing with respect to the flexible circuit board 1 thus produced.

Figure 2B:
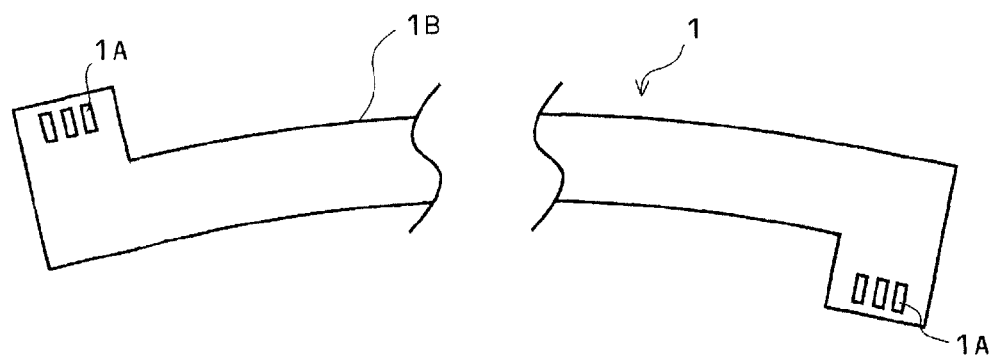

As shown in FIG. 2(b), the flexible circuit board 1 according to this embodiment is formed with an arc shaped portion 1B in a state before the shaping or forming of the spiral part 5, and the spiral part 5 is formed by carrying out the shaping processing with respect to this arc shaped portion 1B, which will be described below. Although in FIG. 2(b), almost the whole of the flexible circuit board 1 is formed in an arc shape only at leas a portion of the flexible circuit board 1 corresponding to the spiral part 5 should be formed in an arc shape. By forming the spiral part 5 with the arc shaped portion 1B in this manner, the diameter of the hollow interior portion 6 of the spiral part 5 can be made almost constant. As a result, in cases where another wiring, etc. made to pass through the hollow interior portion 6 of the spiral part 5, for example, the possibility that the wiring and the spiral part 5 interfere with each other can be reduced.

The shaping processing of the spiral part 5 includes: a first step to wind the flexible circuit board 1 around a shaping device 13 of a circular column shape in a state in which tension is applied to the opposite ends of the flexible circuit board 1, thereby to shape the spiral part 5; and a second step to heat a portion of the flexible circuit board 1 wound around the shaping device 13, thereby to form the spiral part 5 in the flexible circuit board 1.

In the first step, by pulling the opposite ends of the flexible circuit board 1 by means of an unillustrated pulling unit, the flexible circuit board 1 is wound around the shaping device 13, with tension being applied to the opposite ends of the flexible circuit board 1, whereby a portion of the flexible circuit board 1 is shaped into a spiral shape. The size or length in the diametrical direction of the hollow interior portion 6 can be changed by changing the diameter of the shaping device 13, and similarly, the number of turns of the spiral part 5, the interval of adjacent turns of the spiral part 5, and so on, can be set optionally or at will by changing the number of turns and the interval of adjacent turns of the shaping device 13 in a suitable manner. In addition, a tensile force at the time of applying tension to the flexible circuit board 1 should just be an applied force by which the spiral part 5 is at least formed or shaped in the flexible circuit board 1 in a reliable manner, and the applied force can be changed in a suitable manner in accordance with the thickness, the material, etc., of the flexible circuit board 1.

In the second step, the flexible circuit board 1, which is formed into the spiral shape by applying tension to the opposite ends thereof, in particular at least the portion thereof formed into the spiral shape (that portion which is wound around the shaping device 13) is heated. Although in this embodiment, the flexible circuit board 1 armed in the spiral shape is heated by putting the flexible circuit board 1 into a heating device together with the shaping device 13, it may be constructed such that a heating member is arranged in the interior of the shaping device 13, whereby at least that portion of the flexible circuit board 1 which is formed into the spiral shape is heated by the heat generated from the shaping device 13. Thus, by heating the portion of the flexible circuit board 1 formed into the spiral shape in this manner, it is possible to shape or form the spiral part 5 with respect to the flexible circuit board 1.

Here, note that in this embodiment, the temperature of heating is set to a temperature at which the surface temperature of the flexible circuit board 1 becomes equal to or higher than 150 degrees C. and less than a thermal deformation starting temperature of the liquid crystal polymer, and the time of heating is set within 1 hour. When the heating is carried out at the temperature at which the surface temperature of the flexible circuit board 1 is equal to or higher than 150 degrees C. and less than the thermal deformation starting temperature of the liquid crystal polymer, the liquid crystal polymer is not fluidized to flow, and the external appearance and performance of the flexible circuit board 1 are not impaired. In addition, because the heating temperature is such that the surface temperature of the flexible circuit board 1 becomes equal to or higher than 150 degrees C., the spiral part 5 can be formed or shaped with respect to the liquid crystal polymer in a reliable manner, and further, even after the heating is finished, the spiral part 5 does not return to its original shape. Moreover, if the heating time is within 1 hour, the efficiency of production can be improved, and at the same time, it becomes possible to avoid problems of the discoloration and thermal deformation of the liquid crystal polymer, as well as damage to the wiring layer 3A, which would otherwise be generated by heating for an extended period of time.

Note that herein is described the case where the liquid crystal polymer is used for the insulating film 2 and the insulating layer 4, but as stated above, materials which can be applied to the insulating film 2 and the insulating layer 4 are not limited to this. In cases where another material is selected, the spiral part 5 can be shaped or formed by changing the above-mentioned heating temperature and heating time in a suitable manner (however, an upper limit of the heating temperature is a temperature which becomes less than the thermal deformation starting temperature of the material thus selected).

By carrying out the first step and the second step as referred to above, it becomes possible to produce the flexible circuit board 1 which is formed with the spiral part 5 and which can be deformed in an elastic manner and/or in a torsional manner. Here, note that the first step and the second step may be carried out at the same time.

(5: Verification of Effects)

In order to verify the effects of the flexible circuit board and the method for production thereof according to this embodiment, comparisons between this embodiment and comparative examples were carried out under verification experiments shown below. The result of the verification will be described hereinafter.

Figure 6A:
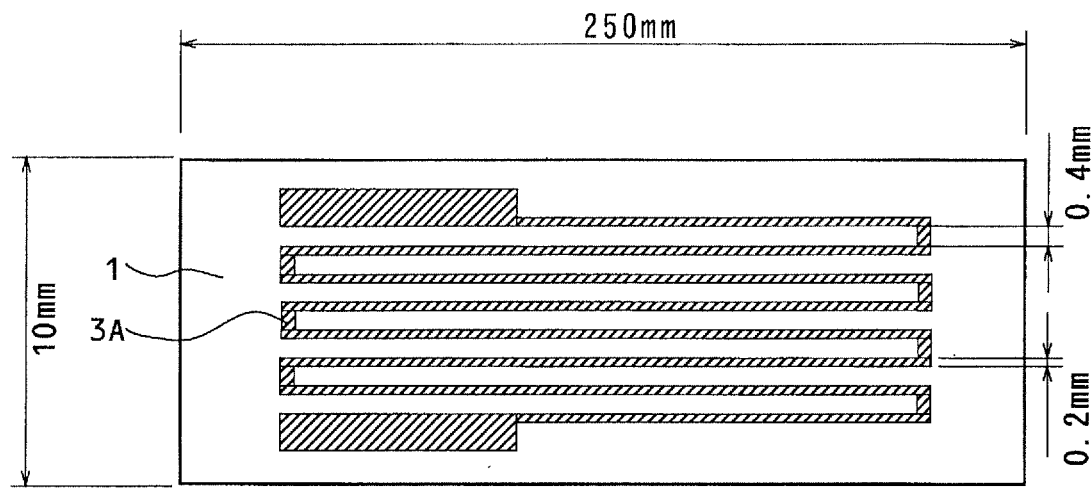
[FIG. 6] is views showing a method for an expansion and contraction test of a flexible circuit board according to the present invention.
Figure 6B:
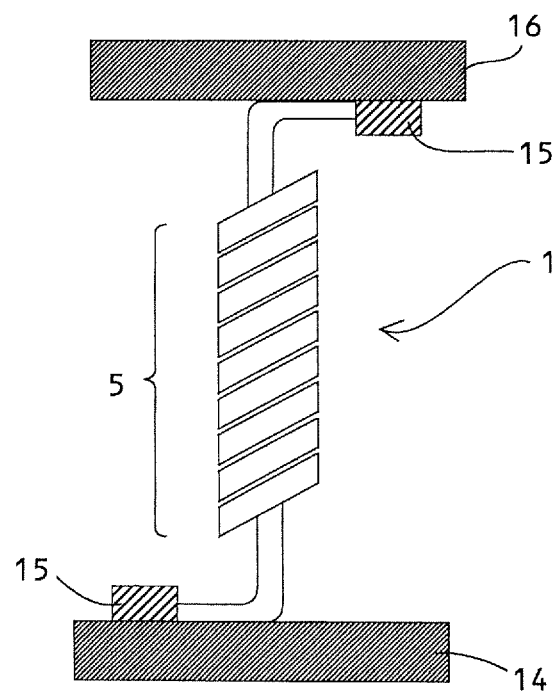

First, in a first through a fifth comparative example, as a copper-covered film, there was prepared Esperflex (trade name) (made of Sumitomo Metal Mining, Co., Ltd., polyimide film: Kapton-EN, film thickness: 50 μm, thickness of copper foil: 18 μm) which is a single-sided copper-covered two-layer polyimide film. In addition, in a sixth through a tenth comparative example, as a copper-covered film, there was prepared a single-sided copper-covered three-layer polyimide film (polyimide film: Kapton-EN, film thickness: 50 μm, thickness of rolled copper foil: 18 μm, adhesive: epoxy resin, thickness of adhesive layer: 10 μm). Subsequently, etching processing was carried out on these samples, so that a wiring layer 3A having a wiring pattern as shown in FIG. 6(*a*) was formed, and a single-sided flexible circuit board 1 was obtained. The width of the circuit board, the width of wiring, and so on, are as shown in this figure. Here, note that the polyimide film, Kapton-EN, used herein has a thermosetting property, and the circuit boards of the first through tenth comparative examples and the flexible circuit board 1 according to this embodiment are different from each other at least in this point.

Subsequently, the single-sided flexible circuit board was shaped into the circular spiral part 5 under the conditions (surface temperature (degrees C.) of the board, shaping time (h)) which are described in Table 1. Note that here, the same as the shaping device 13 used in this embodiment is used as a shaping device.

TABLE 1

| Sample | Surface temperature (° C.) | Shaping time (h) |
|---|---|---|
| Comparative example 1 | 100 | 1 |
| Comparative example 2 | 150 | 1 |
| Comparative example 3 | 200 | 1 |
| Comparative example 4 | 250 | 1 |
| Comparative example 5 | 300 | 1 |
| Comparative example 6 | 100 | 1 |
| Comparative example 7 | 150 | 1 |
| Comparative example 8 | 200 | 1 |
| Comparative example 9 | 250 | 1 |
| Comparative example 10 | 300 | 1 |

In order to evaluate the connection reliability of each sample thus obtained, a "repeated expansion and contraction test" was carried out. A test method will be briefly described with reference to FIG. 6(*b*). FIG. 6(*b*) schematically shows a device for carrying out the "repeated expansion and contraction test". First, in carrying out the test, the opposite ends of each flexible circuit board 1 to be tested are fixedly secured at fastening portions 15 to a stationary or fixed plate 14 and a vertically movable plate 16, respectively. In a stage before the start of the test, the distance between the fixed plate 14 and the vertically movable plate 16 was set such that each flexible circuit board 1 was in the most contracted state thereof. In addition, the distance between the fixed plate 14 and the vertically movable plate 16 in a fully expanded state of each flexible circuit board 1 was set to be a value at which the flexible circuit board 1 become the most expanded.

Subsequently, the vertically movable plate 16 was moved to reciprocate in the vertical direction, 100,000 times at a speed of 100 mm/second. Thereafter, those flexible circuit boards in which the resistance value of the wiring layer 3A after the expansion and contraction thereof increased by 10% or more from that before the expansion and contraction were assumed to be "defective". The number of tests (N) was set to 20 for each sample. The results of such tests are shown in Table 2. Here, note that "success or failure in shape maintenance" in Table 2 is an evaluation on whether the size in the diametrical direction of the hollow interior portion 6 of each spiral part 5 was maintained with respect to the shape hereof after the tests. In addition, "success or failure in shaping" is an examination as to whether the size in the diametrical direction of the hollow interior portion 6 was a target value, after each flexible circuit board was taken out from the shaping device 13.

Here note that in Table 2, the criteria for the success or failure in shaping and the criteria for the success or failure in shape maintenance are defined as follows. O: the size in the diametrical direction of the hollow interior portion is less than ±10% of a design value; Δ: the size in the diametrical direction of the hollow interior portion is equal to or more than ±10% and less than ±20% of the design value; and x: the size in the diametrical direction of the hollow interior portion is equal to or more than ±20% of the design value. Also, the criteria for the external appearance are defined as follows. O:

the outflow of the insulating film or the insulating layer is not recognized; and x: the outflow of the insulating film or the insulating layer is recognized.

TABLE 2

| Sample | success or failure in shaping | success or failure in shape maintenance | External appearance | Number of occurrence of defects (N = 20) |
|---|---|---|---|---|
| Comparative example 1 | X | — | — | — |
| Comparative example 2 | X | — | — | — |
| Comparative example 3 | X | — | — | — |
| Comparative example 4 | X | — | — | — |
| Comparative example 5 | X | — | — | — |
| Comparative example 6 | X | — | — | — |
| Comparative example 7 | X | — | — | — |
| Comparative example 8 | Δ | X | ○ | 7 |
| Comparative example 9 | Δ | X | ○ | 9 |
| Comparative example 10 | Δ | X | ○ | 10 |

From Table 2, it has been found that in the first comparative example through the seventh comparative example, no spiral part was formed in flexible circuit boards even if the flexible circuit boards were heated. In addition, it has also been found that in the eighth comparative example through the tenth comparative example, a spiral part was formed when each flexible circuit board was heated, but when the above-mentioned expansion and contraction tests were carried out, the size in the diametrical direction of each hollow interior portion was changed to a large extent, and it was difficult for each hollow interior portion to, maintain the diametrical size thereof. Accordingly, similar tests were carried out with respect to the following samples A through E. The conditions of the samples A through E are as shown below (Table 3).

In the samples A through E, the liquid crystal polymer was used for the insulating film 2 and the insulating layer 4, similar to this embodiment. That is, first, as a copper-covered film, there was prepared Esperflex L (trade name) (made by Nippon Steel Chemical Co., Ltd., film thickness: 50 μm, thickness of rolled copper foil: 18 μm, thermal deformation starting temperature: 290 degrees C.) which is a single-sided copper-covered liquid crystal polymer film. Subsequently, etching processing was carried out on these samples, so that a wiring layer 3A having a wiring pattern as shown in FIG. 6(*a*) was formed, and a single-sided flexible circuit board 1 was obtained. The width of the circuit board, the width of wiring, and so on are as shown in this figure. Then, a spiral part 5 was formed in the flexible circuit board 1 under conditions as shown in Table 3, and the above-mentioned expansion and contraction tests were carried out on the flexible circuit board 1 with the spiral part 5 thus formed therein. The result of the tests is shown in Table 4.

TABLE 3

| Sample | Surface temperature (° C.) | Shaping time (h) |
|---|---|---|
| A | 100 | 1 |
| B | 150 | 1 |
| C | 200 | 1 |

TABLE 3-continued

| Sample | Surface temperature (° C.) | Shaping time (h) |
|---|---|---|
| D | 250 | 1 |
| E | 300 | 1 |

TABLE 4

| Sample | success or failure in shaping | success or failure in shape maintenance | External appearance | Number of occurrence of defects (N = 20) |
|---|---|---|---|---|
| A | X | — | — | — |
| B | ○ | Δ | ○ | 0 |
| C | ○ | ○ | ○ | 0 |
| D | ○ | ○ | ○ | 0 |
| E | Δ | X | X | 9 |

From the results of the tests shown in Table 4, it has been found that when the flexible circuit board 1 is heated so as to raise the surface temperature thereof to 100 degrees C., it is difficult to shape or form the spiral part 5 itself, as in the case of the sample A. On the other hand, it has also been found that when the flexible circuit board 1 is heated so that the surface temperature thereof becomes 300 degrees C., as in the case of the sample E, the thermal deformation starting temperature of the liquid crystal polymer will be exceeded, and hence, the thermal deformation of the liquid crystal polymer will begin and the liquid crystal polymer will be fluidized to flow. That is, it has been found that even if the spiral part 5 is formed, it is difficult to maintain the size in the diametrical direction of the hollow interior portion 6 after heating thereof. In addition, because the liquid crystal polymer is fluidized to flow, it has been confirmed that the external appearance does not reach an acceptable level, either.

Here, it has been found that if the surface temperature of the flexible circuit board 1 is equal to or higher than 150 degrees C. and less than the thermal deformation starting temperature of the liquid crystal polymer, as in the case of the samples B through D, the spiral part 5 can be shaped, and even after the above-mentioned tests have been carried out, the size in the diametrical direction of the hollow interior portion 6 is maintained, and in addition, the external appearance is also at an acceptable level. That is, it can be said that the temperature of "150 degrees C." is a lower limit heating temperature at which the spiral part 5 can be formed and the size in the diametrical direction of the hollow interior portion 6 thus formed can be maintained even if the expansion and contraction tests are carried out (although the liquid crystal polymer is used in this embodiment, this temperature can also be of course changed in cases where other materials are used). Note that the heating time is here set to 1 hour, but according to inventors' keen study and examination, it has been found that even if the heating time is less than 1 hour, "the success in shaping", "the success in shape maintenance", and "the external appearance" each sufficiently reach an acceptable level.

From the above, the following can be said.

In the case of using a thermosetting resin, the spiral part 5 can not be formed, or the size in the diametrical direction of the hollow interior portion 6 can not be maintained.

It has been found that in the case of using a thermoplastic resin (i.e., in the case of the liquid crystal polymer), the spiral part 5 can be shaped or formed when the heating temperature is a temperature at which the surface temperature of the flexible circuit board becomes equal to or higher than 150 degrees C. and less than the thermal deformation starting temperature of the liquid crystal polymer, and when the shaping time is within 1 hour, and even if the above-mentioned expansion and contraction tests are carried out, the size in the diametrical direction of the hollow interior portion 6 can be maintained. In addition, it has been found that the external appearance is also at an acceptable level.

As described above, according to the present invention, it becomes possible to provide a flexible circuit board and a method for production thereof in which in cases where elastic wiring in movable parts of a robot, etc., is required, the wiring can be made to expand and contract with a simple arrangement, and at the same time, the circuit board is excellent in weight reduction as well as size reduction, and breaking or disconnection and exfoliation of a wiring layer do not take place easily, even in cases where the circuit board is deformed in a repeated manner.

EXPLANATION OF REFERENCE NUMERALS AND CHARACTERS

1 . . . flexible circuit board, 1A . . . terminals, 1B . . . arc shaped portion, 2 . . . insulating film(s), 3A - 3C . . . wiring layers, 4 . . . insulating layer(s), 5 . . . spiral part, 6 . . . hollow interior portion, 8 . . . adhesive layer(s), 9 . . . metal covered film, 10. . . metal foil, 11 . . . adhesive sheet, 12 . . . through hole, 12a through hole plating, 13 . . . shaping device, 14 . . . stationary or fixed plate, 15 . . . fastening part, 16 . . . vertically movable plate, and 30 . . . metal foil.

The invention claimed is:

1. A flexible circuit board comprising:
an insulating film made of a thermoplastic resin;
a wiring layer formed on said insulating film; and
an insulating layer made of a thermoplastic resin and formed on said wiring layer;
wherein a spiral part shaped into a spiral shape is formed in at least a part of said flexible circuit board;
said spiral part is shaped in such a manner that a part of a circumferential surface and another adjacent part of the circumferential surface mutually overlap with each other;
said spiral part is shaped in an arc shaped portion which is formed in said flexible circuit board in a state where said spiral part has not been shaped; and
said flexible circuit board is constructed to be expandable and contractable, and/or torsionally deformable in said spiral part.

2. The flexible circuit board as set forth in claim 1, wherein said thermoplastic resin is a liquid crystal polymer.

3. The flexible circuit board as set forth in claim 2, wherein
said wiring layer is formed on opposite side surfaces of said insulating film;
said wiring layer formed on one side surface of said insulating film is used as a signal line for signal transmission; and
said wiring layer formed on the other side surface of said insulating film is used as a power line for supplying electric power.

4. The flexible circuit board as set forth in claim 2, wherein
said wiring layer is formed on opposite side surfaces of said insulating film;
said wiring layer formed on one side surface of said insulating film is used as at least one of a signal line for signal transmission and a power line for supplying electric power;
said wiring layer formed on the other side surface of said insulating film is used as a ground pattern; and
in said spiral part, said other side surface is arranged at an outer peripheral side more outside than said one side surface.

5. The flexible circuit board as set forth in claim 2, wherein said spiral part is constructed in such a manner that another wiring is able to pass through its hollow interior portion.

6. The flexible circuit board as set forth in claim 2, wherein said spiral part is formed by a method comprising:
winding said flexible circuit board around a shaping device of a circular column shape in a state in which tension is applied to opposite ends of said flexible circuit board in a first step; and
heating that portion of said flexible circuit board which is wound around said shaping device to shape said spiral part in said flexible circuit board in a second step.

7. The flexible circuit board as set forth in claim 1, wherein
said wiring layer is formed on opposite side surfaces of said insulating film;
said wiring layer formed on one side surface of said insulating film is used as a signal line for signal transmission; and
said wiring layer formed on the other side surface of said insulating film is used as a power line for supplying electric power.

8. The flexible circuit board as set forth in claim 7, wherein said spiral part is constructed in such a manner that another wiring is able to pass through its hollow interior portion.

9. The flexible circuit board as set forth in claim 7, wherein said spiral part is formed by a method comprising:
winding said flexible circuit board around a shaping device of a circular column shape in a state in which tension is applied to opposite ends of said flexible circuit board in a first step; and
heating that portion of said flexible circuit board which is wound around said shaping device to shape said spiral part in said flexible circuit board in a second step.

10. The flexible circuit board as set forth in claim 1, wherein
said wiring layer is formed on opposite side surfaces of said insulating film;
said wiring layer formed on one side surface of said insulating film is used as at least one of a signal line for signal transmission and a power line for supplying electric power;
said wiring layer formed on the other side surface of said insulating film is used as a ground pattern; and
in said spiral part, said other side surface is arranged at an outer peripheral side more outside than said one side surface.

11. The flexible circuit board as set forth in claim 10, wherein said spiral part is constructed in such a manner that another wiring is able to pass through its hollow interior portion.

12. The flexible circuit board as set forth in claim 10, wherein said spiral part is formed by a method comprising:
winding said flexible circuit board around a shaping device of a circular column shape in a state in which tension is applied to opposite ends of said flexible circuit board in a first step; and
heating that portion of said flexible circuit board which is wound around said shaping device to shape said spiral part in said flexible circuit board in a second step.

13. The flexible circuit board as set forth in claim 1, wherein said spiral part is constructed in such a manner that another wiring is able to pass through its hollow interior portion.

14. The flexible circuit board as set forth in claim 13, wherein said spiral part is formed by a method comprising:

winding said flexible circuit board around a shaping device of a circular column shape in a state in which tension is applied to opposite ends of said flexible circuit board in a first step; and heating that portion of said flexible circuit board which is wound around said shaping device to shape said spiral part in said flexible circuit board in a second step.

15. The flexible circuit board as set forth in claim 1, wherein said spiral part is formed by a method comprising:

winding said flexible circuit board around a shaping device of a circular column shape in a state in which tension is applied to opposite ends of said flexible circuit board in a first step; and heating that portion of said flexible circuit board which is wound around said shaping device to shape said spiral part in said flexible circuit board in a second step.

16. The flexible circuit board as set forth in claim 15, wherein said thermoplastic resin is a liquid crystal polymer;

in said second step, a heating temperature is a temperature at which a surface temperature of said flexible circuit board becomes equal to or higher than 150 degrees C. and less than a thermal deformation starting temperature of the liquid crystal polymer; and a heating time is within 1 hour.

17. A method for production of a flexible circuit board comprising:

an insulating film made of a thermoplastic resin;

a wiring layer formed on said insulating film; and an insulating layer made of a thermoplastic resin and formed on said wiring layer, and wherein:

a spiral part shaped into a spiral shape is formed in at least a part of said flexible circuit board; and said flexible circuit board is constructed to be expandable and contractable, and/or torsionally deformable in said spiral part;

said method for production of a flexible circuit board being characterized by comprising:

a first step to wind said flexible circuit board around a shaping device of a circular column shape in a state in which tension is applied to opposite ends of said flexible circuit board; and a second step to heat that portion in said flexible circuit board which is wound around said shaping device, thereby to shape said spiral part in said flexible circuit board;

wherein said thermoplastic resin is a liquid crystal polymer;

wherein in said second step, a heating temperature is a temperature at which a surface temperature of said flexible circuit board becomes equal to or higher than 150 degrees C. and less than a thermal deformation starting temperature of the liquid crystal polymer; and wherein in said second step, a heating time is within 1 hour.

* * * * *